(12) United States Patent
Mangano et al.

(10) Patent No.: US 10,985,736 B2
(45) Date of Patent: Apr. 20, 2021

(54) DEVICE AND METHOD FOR POWER SUPPLY MANAGEMENT

(71) Applicants: STMicroelectronics S.r.l., Agrate Brianza (IT); STMicroelectronics (Rousset) SAS, Rousset (FR)

(72) Inventors: Daniele Mangano, San Gregorio di Cata (IT); Roland Van Der Tuijn, Mouans-Sartoux (FR); Pasquale Butta', Messina (IT)

(73) Assignees: STMicroelectronics S.r.l., Agrate Brianza (IT); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/894,640

(22) Filed: Jun. 5, 2020

(65) Prior Publication Data

US 2020/0389153 A1 Dec. 10, 2020

(30) Foreign Application Priority Data

Jun. 7, 2019 (IT) .......................... 102019000008385

(51) Int. Cl.
- *H03K 3/01* (2006.01)
- *H03K 17/20* (2006.01)
- *G06F 1/24* (2006.01)
- *H03K 19/20* (2006.01)

(52) U.S. Cl.
CPC ............... *H03K 3/01* (2013.01); *H03K 19/20* (2013.01)

(58) Field of Classification Search
CPC ...... H03K 3/01; H03K 3/012; H03K 3/02335; H03K 17/20; H03K 17/22; H03K 17/30; G06F 1/24; G06F 1/26; G06F 1/266; G06F 1/28; G06F 1/30; G06F 1/305
See application file for complete search history.

(56) References Cited

U.S. PATENT DOCUMENTS

| | | | |
|---|---|---|---|
| 9,965,025 B2 * | 5/2018 | Yuasa | G06F 1/263 |
| 10,615,779 B1 * | 4/2020 | Butenhoff | H03K 17/04206 |
| 2002/0180497 A1 | 12/2002 | Kim | |

FOREIGN PATENT DOCUMENTS

JP 2017096776 A 6/2017

* cited by examiner

*Primary Examiner* — An T Luu
(74) *Attorney, Agent, or Firm* — Slater Matsil, LLP

(57) ABSTRACT

An embodiment device comprises a processing circuit and IP circuitry coupled to a power supply line, wherein the IP circuitry has an IP circuitry supply threshold for IP circuitry operation. A supply monitor circuit is coupled to the power supply line to sense the voltage on the power supply line and to switch the processing circuit to a low-power mode as a result of a drop in the voltage on the power supply line. The supply monitor circuit comprises a threshold setting node and is configured to be deactivated as a result of the voltage on the power supply line dropping below a deactivation threshold level set at the threshold setting node. A threshold setting circuit is configured to apply to the threshold setting node of the supply monitor circuit the IP circuitry supply threshold as a result of the processing circuit being in the low-power mode.

14 Claims, 8 Drawing Sheets

DEVICE AND METHOD FOR POWER SUPPLY MANAGEMENT

CROSS-REFERENCE TO RELATED APPLICATIONS

This application claims priority to Italian Application No. IT102019000008385, filed on Jun. 7, 2019, which application is hereby incorporated herein by reference.

TECHNICAL FIELD

The description relates to power supply in electronic devices.

One or more embodiments may be applied, for instance, to supplying processing devices such as general-purpose micro-controllers (MCUs).

One or more embodiments may be applied in low-power devices.

BACKGROUND

In various application contexts, facilitating power-effective co-existence of circuitry with different (minimum) operating voltages may represent a desirable feature. For instance, this may facilitate a user in defining in a flexible manner actions taken when low-voltage conditions are detected.

An approach to address that issue may involve limiting the operating voltage to a "worst case" condition. Such an approach may be far from providing an ideal solution: indeed, retaining the capability of operating a device, even with limited functionality/performance, may be desirable in various circumstances.

Another approach may involve using dedicated voltage monitors. While satisfactory under various respects, such an approach may be exposed to certain limitations related to the capability for various parts of a system to operate autonomously with different voltage specifications.

SUMMARY

An object of one or more embodiments is to contribute in further addressing the issues discussed above.

According to one or more embodiments, that object can be achieved by means of a device having the features set forth in the claims that follow.

A device including a microcontroller unit (MCU) and IP core circuitry (briefly, IP circuitry) may be exemplary of such a device.

The claims are an integral part of the technical disclosure of embodiments as provided herein.

One or more embodiments may involve using a general-purpose voltage monitor which, in conjunction with a specific hardware approach, facilitates managing low-power system operation even when different parts of the system operate autonomously.

One or more embodiments may offer advantages under various respects such as, for instance:
- flexibility in terms of software configuration, for instance via a software-enabling mechanism, threshold configuration by registers, interrupt-driven operation while a CPU is not in a low-power mode;
- autonomous operation: certain parts of a system can be rendered optionally active while, for instance, a MCU is in a low-power mode, with the capability of waking-up from the low-power mode the MCU (CPU) as a result of supply drop detected, for instance; and
- low-power support, for instance via hardware monitor switch-off when an associated IP is not active and the system is in a low-power mode and/or a mechanism to force an IP threshold when the system is in a low-power mode.

One or more embodiments retain the possibility of configuring operating features by software with software-defined actions facilitating a final user in deciding what to do in case of voltage drops. This facilitates taking actions (such as output power reduction, switch-off and so on) related to the specific application context while retaining a substantial flexibility in selecting such actions.

One or more embodiments may involve a general-purpose voltage monitor circuit which, in conjunction with a certain hardware approach, facilitates a management of low-power system operation even in those arrangements where different parts of a system are intended to operate autonomously.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
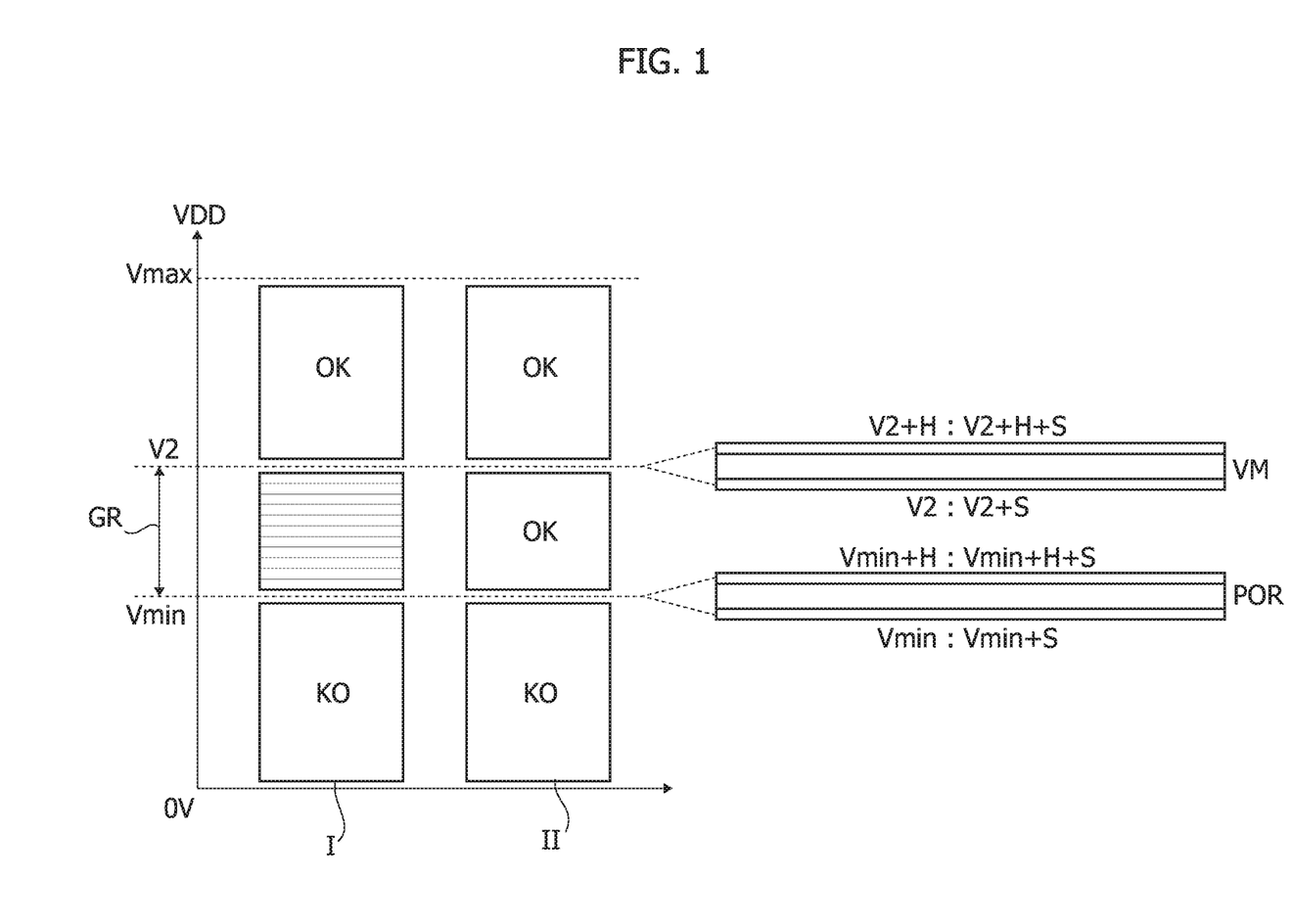
FIG. 1 is a schematic representation of issues addressed in one or more embodiments.

FIG. 1 is a schematic representation of possible supply conditions of an electronic device.

An electronic circuit comprising a processing unit (a microcontroller unit or MCU, for instance) with the capability of being coupled to IP circuitry, namely one or more intellectual property cores (briefly, IP cores or, simply, IPs) may be exemplary of such a device.

The designation IP core (or, briefly, IP) is a well-known designation adopted in electronic design to designate a reusable unit of logic, cell or integrated circuit design which can be used as building blocks of integrated circuits such as ASICs (Application-Specific Integrated Circuits) or FPGAs (Field-Programmable Gate Arrays).

FIG. 1 refers to possible supply conditions of such a device via a supply voltage VDD in a range from 0 V to a maximum value Vmax, with the voltage VDD expected to have a current (nominal) value V2.

In various circumstances and for different reasons known to those of skill in the art, such a supply voltage may decrease to a lowest value Vmin or below.

The representation in FIG. 1 is exemplary of the possibility for different parts of such a device, generally designated I and II, of being:
on the one hand, able to operate reliably ("OK", both of them) for values of VDD at V2 and above,
on the other hand, unable to operate reliably ("KO", again both of them) for values of VDD at Vmin and below.

The representation in FIG. 1 is also exemplary of the possibility for the parts I and II of exhibiting different behaviors for values of VDD between V2 and Vmin: for instance, part I (left) may enter a "grey region" where performance may not be guaranteed, other than with reduced performance, while part II (right) can still operate reliably at a desired performance level ("OK"): that is part I (left) can operate reliably down to V2 while part II (right) can operate reliably down to Vmin.

The right-hand side of FIG. 1 also schematically represents of the possible action of a voltage monitor having a hysteresis H, where H is the difference between a rising threshold (high) and a falling threshold (low) with possible variations of the supply voltage VDD.

FIG. 1 is exemplary of possible variations of VDD both around V2 (V2: V2+S and V2+H: V2+H+S as indicated at VM) and around Vmin (Vmin: Vmin+S and Vmin+H: Vmin+H+S as indicated at POR) depending on whether only one part or both parts (a microcontroller and associated IP circuitry, for instance) are supplied.

The entity S denotes the spread, that is the maximum difference between different silicon parts and different operating conditions (PVT); POR may be indicative of a power-on reset condition in a voltage monitoring system voltages with a power-on reset (POR) to facilitate proper initialization at power-up. The hysteresis H facilitates ensuring monitor output stability against supply noise.

Figure 2:
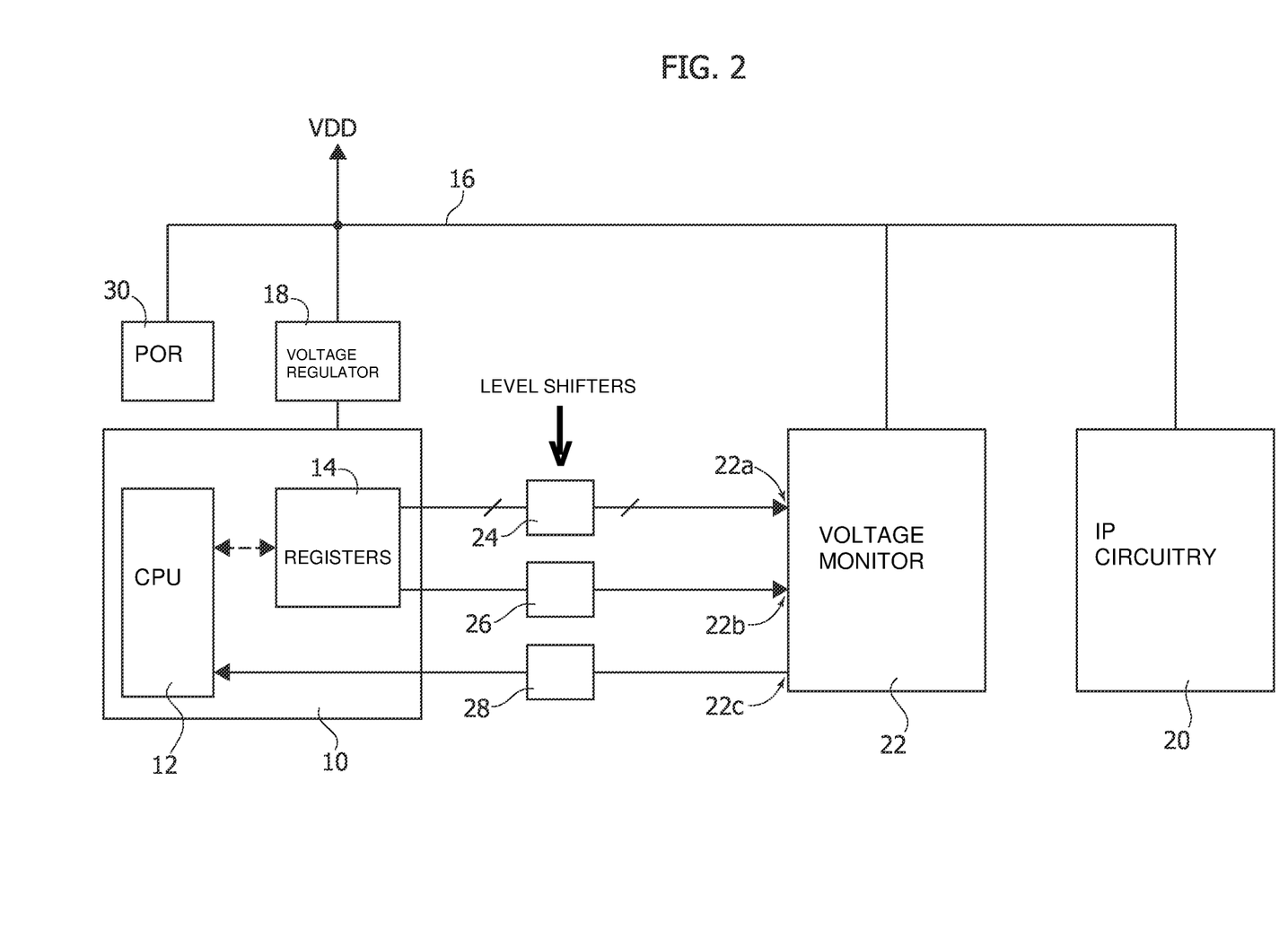
FIG. 2 is an exemplary representation of possible contexts of use of embodiments.

FIG. 2 is exemplary of a possible system architecture including, for instance, a low-voltage logic circuit 10 including a processing unit 12 (a CPU for instance) with associated registers 14 supplied from a supply rail 16 brought (in a manner known to those of skill in the art) to a voltage VDD via a (voltage) regulator 18.

Reference 20 in FIG. 2 denotes IP circuitry (that is one or more IP cores) supplied via the rail 16.

Reference 22 in FIG. 2 indicates a general-purpose voltage monitor configured to monitor (in a manner known per se to those of skill in the art) the (main) supply line (rail 16, for instance).

As exemplified in FIG. 2, the voltage monitor 22 can be configured to cooperate with the low-voltage logic circuit 10 by exchanging signals including:
a threshold signal sent from the logic circuit 10 (from the registers 14, for instance) to an input 22a of the voltage monitor 22,
an enable signal again sent from the logic circuit 10 (from the registers 14, for instance) to an input 22b of the voltage monitor 22,
an interrupt signal sent from an output 22C of the voltage monitor 22 to the logic circuit 10 (to the CPU 12, for instance).

As exemplified in FIG. 2, such exchange of signals may occur via level shifters 24, 26 and 28.

Reference 30 in FIG. 2 denotes a power on reset (POR) circuit as conventional in the art.

It will be appreciated that, throughout FIGS. 2 to 8 like parts or elements are indicated by like reference symbols, so that a detailed description of these parts or elements will not be repeated for each figure for brevity.

As discussed previously (and as exemplified in FIG. 3) a possible approach in managing a low-power mode in a device as considered herein may involve switching-off ("OFF") the low-voltage domain 10—and—the voltage monitor 22. This option may be dictated by considering that keeping the monitor 22 active would amount to supply power being consumed unnecessarily.

Figure 3:
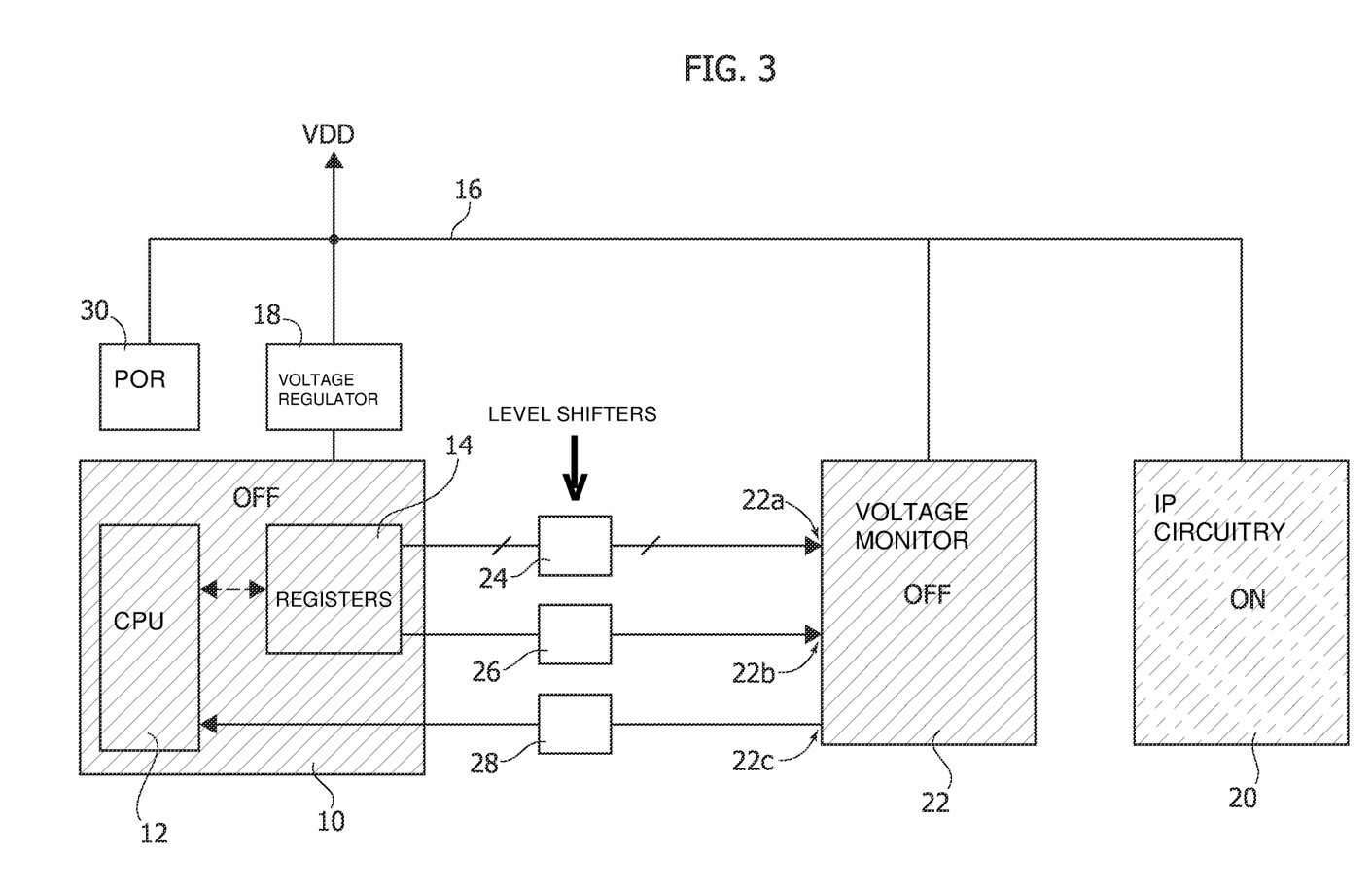
FIGS. 3 to 8 are functional block diagrams exemplary of possible operation of embodiments.

However, a desirable type of operation would involve keeping the IP circuitry 20 active ("ON") while the rest of the system is turned off with the supply voltage provided to the IP circuitry 20 still monitored so that possible action may be taken in case of a supply voltage drop below a desired minimum level.

For instance, by way of reference to FIG. 1, the IP circuitry 20 in FIG. 2 may be exemplary of part I in FIG. 1 which can operate reliably down to voltage V2.

Maintaining the supply level above Vmin may be facilitated (in a manner known to those of skill in the art) by the voltage monitor POR. This may not be enough, as the IP circuitry 20 cannot operate adequately between Vmin and V2, while the monitor 22 will facilitate checking that the supply voltage is above V2.

In one or more embodiments such monitoring (of the supply voltage to the IP circuitry 20, for instance) can be facilitated by keeping the monitor circuit 22 "alive" in such a way that—even with the low-voltage logic 10 switched to a low-power state—a threshold IPT corresponding to a desired operation condition of the IP circuitry 20 is selected and made available to the monitor circuit 22.

Figure 4:
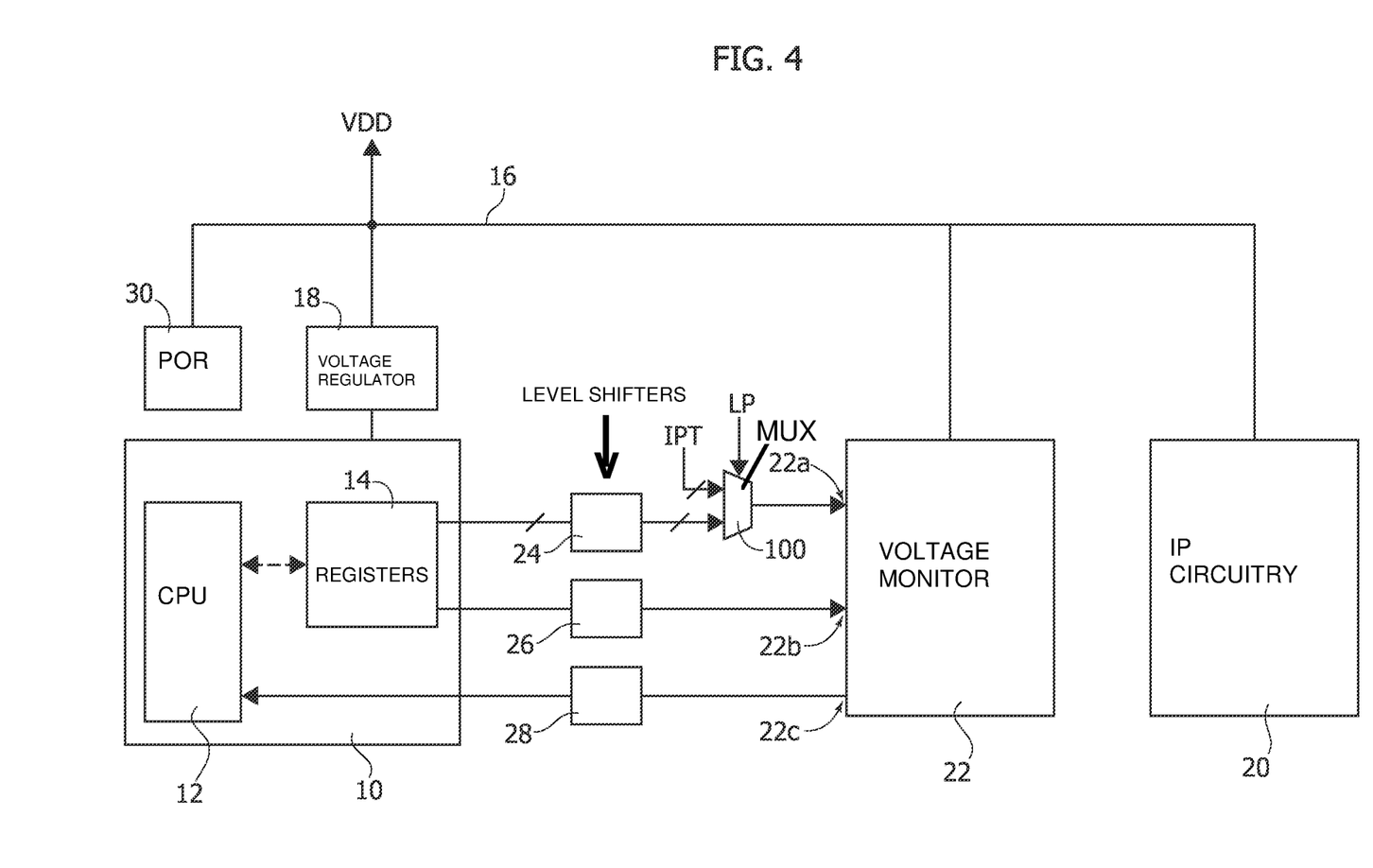

In an embodiment as exemplified in FIG. 4, such an approach can be implemented by means of a multiplexer 100 arranged intermediate the logic circuitry 10 (the registers 14, for instance) and voltage monitor circuit 22 with the multiplexer 100 driven via a signal LP indicative of a low-power state being enforced for the low-voltage domain 10.

For instance, such a signal LP (which can be generated in any manner known to those of skill in the art) can be applied to the multiplexer 100 according to the following principles:
LP=0: this corresponds to normal "transparent" operation of the device where the threshold signal from the registers 14 is transferred towards the input 22a of voltage monitor circuit 22,
LP=1: this corresponds to a low-power operation (the logic circuitry 10 turned off, for instance: this may be for various reasons as known to those of skill in the art) with a desired threshold IPT facilitating IP operation applied to the input 22a of voltage monitor circuit 22.

The IP threshold IPT can be produced in any manner known to those of skill in the art (for instance by resorting to a hard-wired arrangement).

Figure 5:
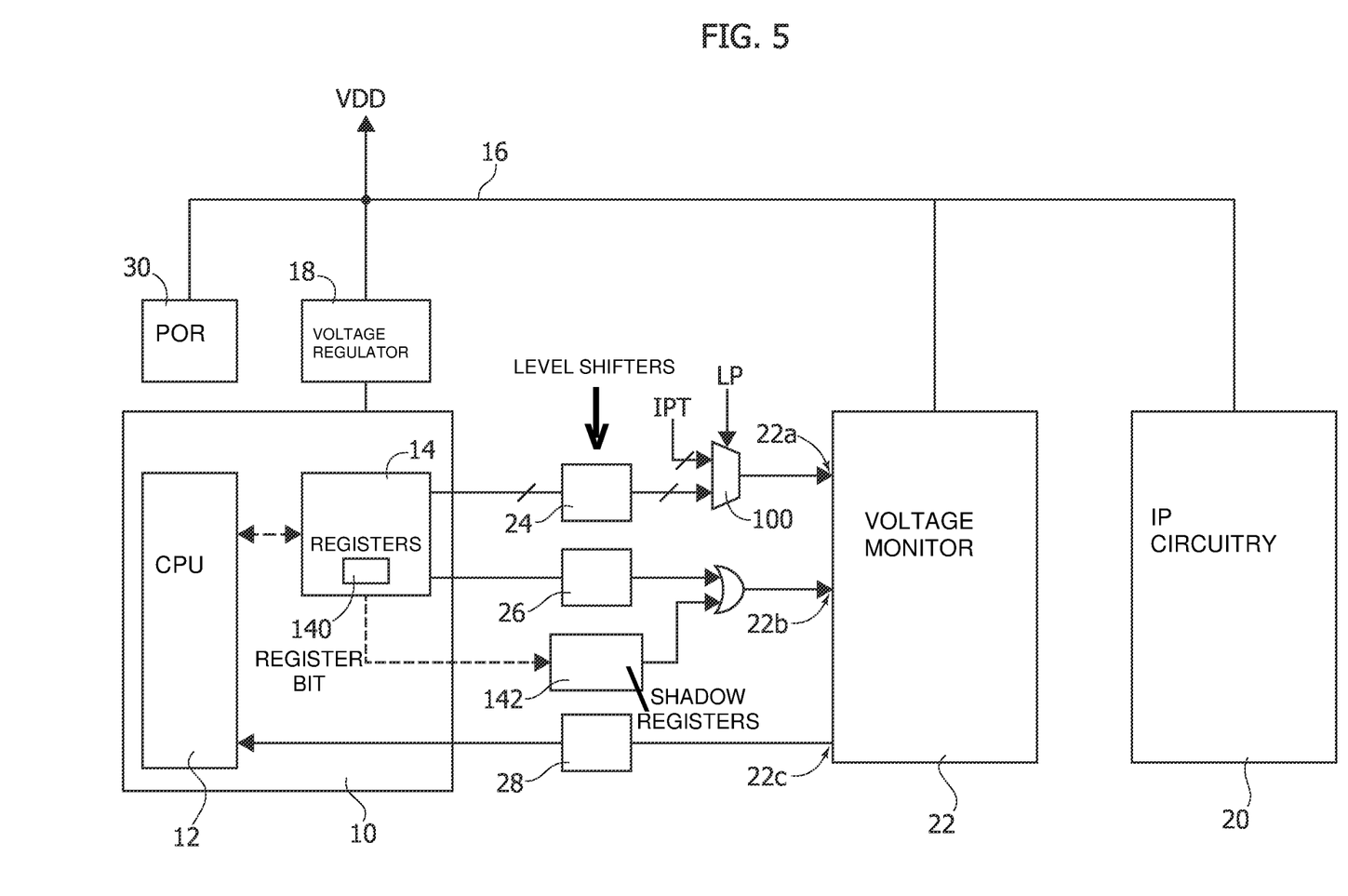

In one or more embodiments as exemplified in FIG. 5, such type of operation can be facilitated by providing a specific register bit 140 in the registers 14 which can be retained in shadow registers 142 and can be set (via software, for instance) so that the voltage monitor circuit 22 may be kept "active" even in a low-power mode (that is with the low-voltage domain 10 switched-off).

For instance (as exemplified in FIG. 5) a corresponding circuit arrangement may include an OR gate 102 having a first input coupled to the logic circuitry 10 (to the registers 14 via the level-shifter 26, for instance) and a second input coupled to the register bit 140 (via the shadow registers 142) so that the enable input 22b may be brought to a logic level ("high" for instance) to keep the voltage monitor 22 active even when the signal coming from the registers 14 via the level shifter 26 would otherwise indicate that the voltage monitor circuit 22 should be disabled.

Figure 6:
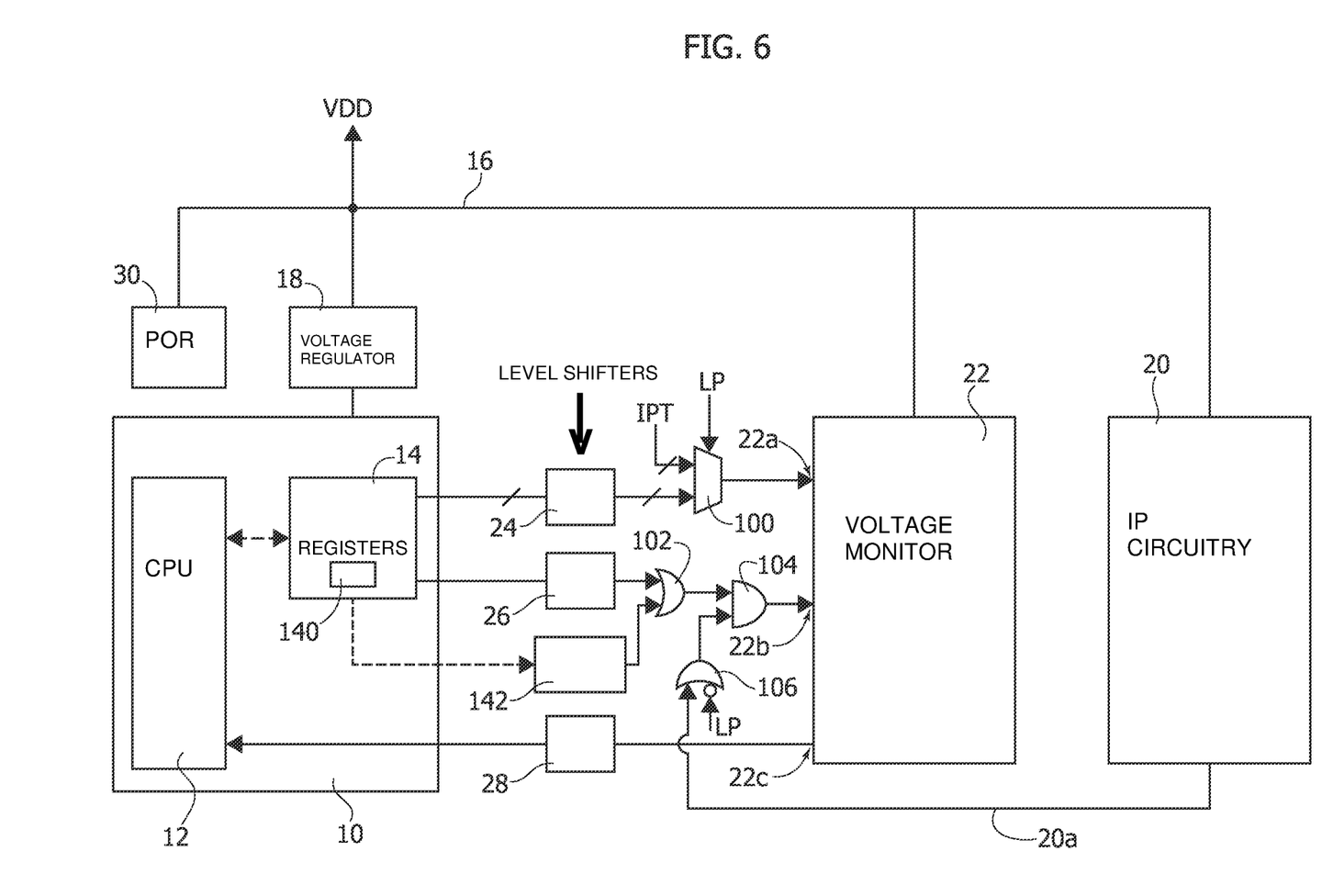

The diagram of FIG. 6 is exemplary of the possibility of sensing (via a sensing line 20a, for instance) the fact that IP circuitry 20 is not active (that is, is not currently activated even if the supply voltage could permit operation) so that the voltage monitor circuit 22 can be switched-off.

In an arrangement as exemplified in FIG. 6 such a result can be achieved by means of logic gate (such an AND gate 104) arranged intermediate the gate 102 and the enable input 22b of the voltage monitor circuit 22.

In an arrangement as exemplified in FIG. 6, the gate 104 has a first input coupled to the output of the gate 102 and a second input coupled to the output from a further logic gate 106 (an OR gate for instance) which in turn has a first input coupled to the sensing line 20a and a second input receiving a negated version of the signal LP, namely LPneg.

In that way, the enable input 22b to the voltage monitor circuit 22 will receive an enable signal ("high", for instance) to keep the voltage monitor circuit 22 active either as a result of the signal on the line 20a indicating that the IP 20 is active—or—as a result of LP=0 (that is, during normal operation with the low-voltage domain 10 turned on). In such normal operation conditions, the enable signal from the registers 14 may be forwarded to the input 22b of the voltage monitor circuit 22 to keep it alive via the gate 102 and the gate 104.

Briefly, one or more embodiments as exemplified herein may facilitate achieving the conditions considered in the following.

When in a low-power (LP) mode (that is 10 is OFF and LP=1):
  if the IP 20 is not active (that is 20a is 0, for instance) the monitor 22 will be OFF;
  if the IP 20 is active (that is 20a is 1, for instance) the fact that voltage monitor 22 is enabled or not will depend on the content of shadow register 142: for instance it may depend on the fact that before going into the LP mode the user requested to have the monitor active by programming a specific register bit.

When in a normal mode (that is, 10 is ON and LP=0), the fact that monitor 22 is active or not may depend (exclusively) on the selection made by the user by programming a specific register bit (and not on the IP activation state).

Figure 7:
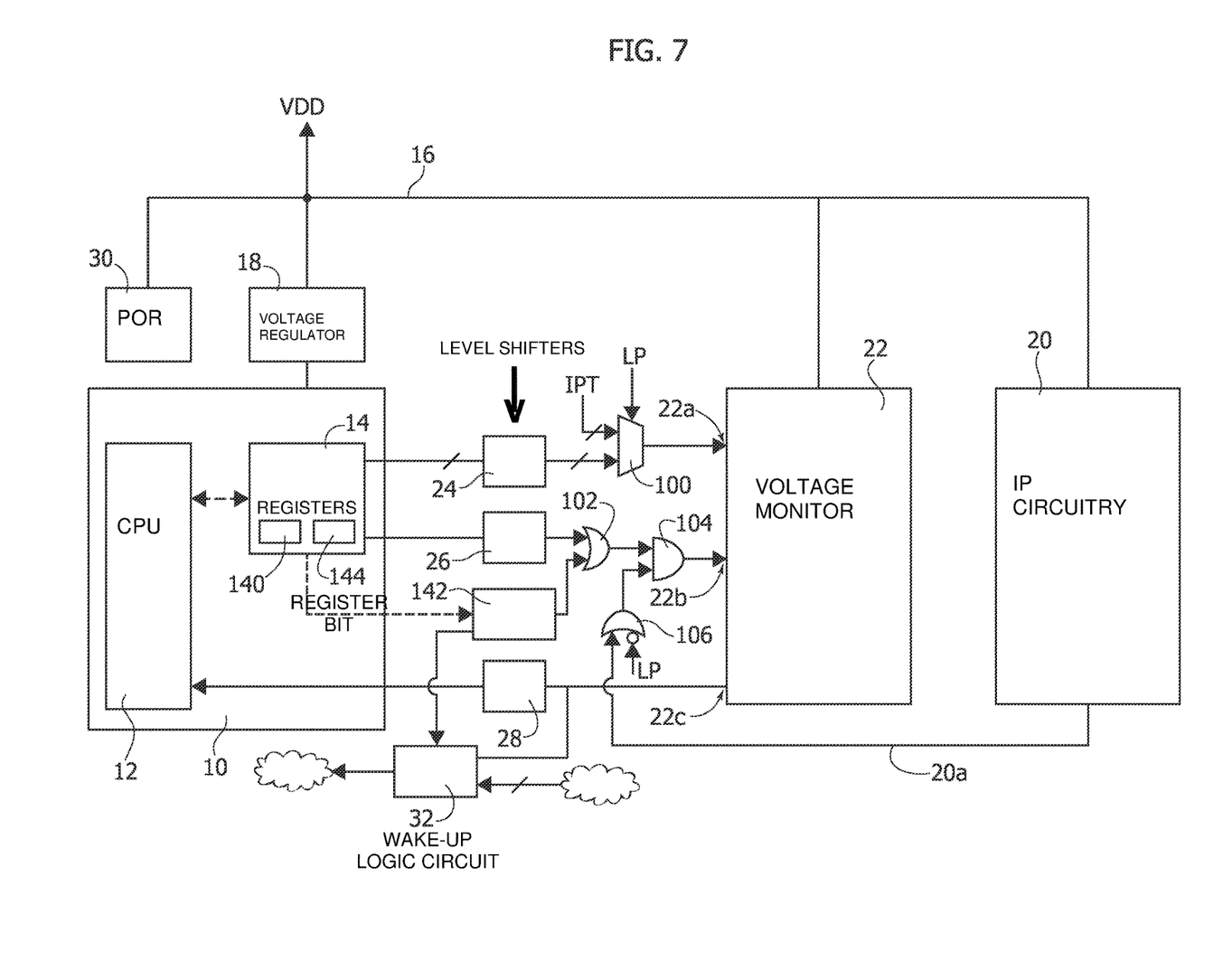

In embodiments as exemplified in FIG. 7, a register bit 144 can be provided in the registers 14 which may be retained in the shadow registers 142 to facilitate software configuration of the system wake-up from a low-power mode via the voltage monitor circuit 22.

Such an arrangement as exemplified in FIG. 7 may involve a wake-up logic circuit 32 sensitive to the wake-up register bit 144 in the shadow registers 142 and an interrupt signal sent to the logic circuitry 10 from the voltage monitor circuit 22 via the output 22C.

Figure 8:
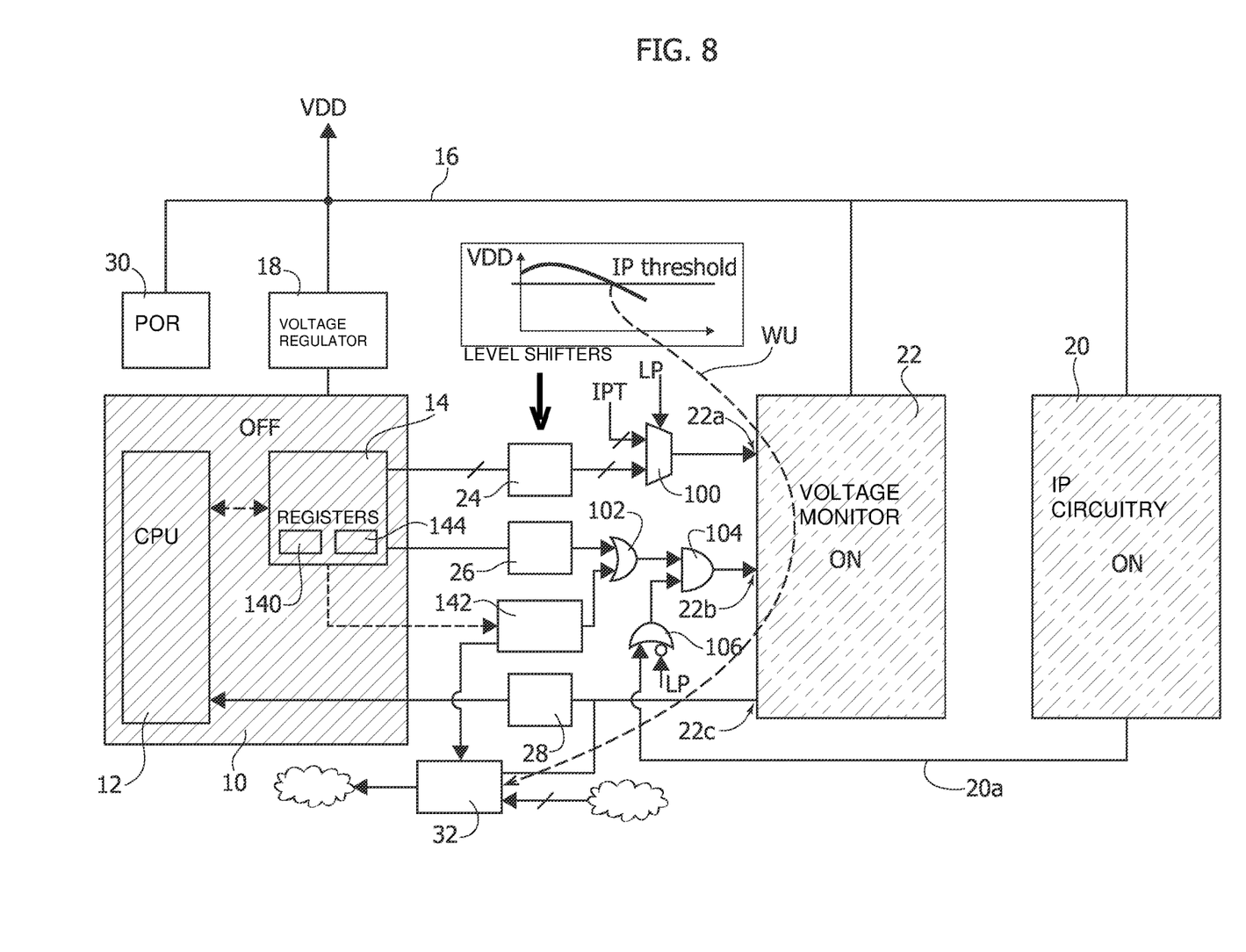

The wake-up logic circuit 32 may operate as exemplified in FIG. 8 to send a wake-up signal WU to the logic circuitry 10 when the supply voltage drops to the IP operation threshold value (that is IPT, for instance) so that if the IP 20 is active the voltage monitor circuit 20 can in any case be kept active. In that way, the voltage drop below the IP threshold IPT can be detected (by the voltage monitor circuit 22, in a manner known to those of skill in the art) and low-voltage domain 10 (the CPU 12, for instance) "woken-up" to take action as possibly desired (for instance reducing RF power, switch-off, and so on).

One or more embodiments may thus provide the capability of monitoring a supply voltage VDD in case of IP autonomous operation by making it unnecessary to keep the full system active, by possibly providing both automatic monitor switch-off when the IP section moves to a non-active state and system wake-up capability.

A device as exemplified herein may comprise:
  a processing circuit (for instance, 10) and IP (core) circuitry (for instance, 20) coupled to a power supply line (for instance, 16), wherein the IP circuitry has an IP circuitry supply threshold (for instance, IPT) for IP circuitry operation (that is, a supply threshold above which satisfactory IP circuitry is obtained), and
  a supply monitor circuit (for instance, 22) coupled to the power supply line and sensitive to a voltage (for instance, VDD) on the power supply line, the supply monitor circuit configured (for instance, 22c) to switch the processing circuit to a low-power mode as a result of a drop in the voltage on the power supply line,
wherein:
  the supply monitor circuit comprises a threshold setting node (for instance, 22a) and is configured to be deactivated as a result of the voltage on the power supply line dropping below a deactivation threshold level set at said threshold setting node,
  a threshold setting circuit (for instance, 100) is provided coupled to the threshold setting node of the supply monitor circuit, the threshold setting circuit configured to apply to the threshold setting node of the supply monitor circuit said IP circuitry supply threshold as a result of the processing circuit being in said low-power mode.

In that way, the monitor circuit can be kept "alive" and monitor supply of the IP circuitry insofar as this latter is active.

In a device as exemplified herein, the threshold setting circuit may comprise a multiplexer (for instance, 100) having an input configured to receive said IP circuitry supply threshold and an output coupled to the threshold setting node of the supply monitor circuit, the multiplexer controlled by a low-power mode signal (for instance, LP) indicative of the processing circuit being switched to said low-power mode.

In a device as exemplified herein:
  the supply monitor circuit may comprise an enable input (for instance, 22b) coupled (for instance, via the gate 102) to the processing circuit,
  enablement maintaining circuitry (for instance, 140, 142, 102, 104, 106) may be provided coupling the processing circuit and the enable input of the supply monitor circuit, the enablement maintaining circuitry configured to apply an enablement signal to the enable input of the supply monitor circuit irrespective of the processing circuit being in said low-power mode (that is irrespective of the value of the low-power mode signal LP being indicative of the processing circuit being switched to the low-power mode).

In a device as exemplified herein, the enablement maintaining circuitry may comprise:

memory circuitry (for instance, 140, 142) having stored therein supply monitor circuit enablement information (an enablement bit, for instance), and an OR gate (for instance, 102) having an output coupled to the enable input of the supply monitor circuit and first and second inputs coupled (for instance, 26) to the processing circuit (via 26, for instance) and said memory circuitry (to receive the enablement bit, for instance), respectively.

A device as exemplified herein may comprise:

an IP activation sensing line (for instance, 20*a*) coupled to said IP circuitry, the IP activation sensing line configured to carry an IP activation signal indicative of the IP circuitry being active or inactive, said enablement maintaining circuitry coupled (for instance, at 104) with said IP activation sensing line to receive therefrom said IP activation signal and discontinue applying said enablement signal to the enable input of the supply monitor circuit as a result of said IP activation signal being indicative of the IP circuitry being inactive.

In a device as exemplified herein, said enablement maintaining circuitry may be sensitive to a low-power mode signal (for instance, LP) indicative of the processing circuit being switched to said low-power mode and configured to deactivate the supply monitor circuit as a result of both said IP activation signal being indicative of the IP circuitry being inactive and said low-power mode signal being indicative of the processing circuit being switched to said low-power mode.

A device as exemplified herein may comprise wake-up circuitry (for instance, 32) coupled to the supply monitor circuit and configured to apply to the processing circuit a wake-up signal (for instance, WU) causing the processing circuit to exit said low-power mode as a result of the voltage on the power supply line dropping below said IP circuitry supply threshold (for instance, IPT).

Without prejudice to the underlying principles, the details and embodiments may vary, even significantly, with respect to what has been described by way of example only without departing from the scope of protection.

The extent of protection is determined by the annexed claims.

What is claimed is:

1. A device comprising:
    a processing circuit and intellectual property core (IP) circuitry coupled to a power supply line, wherein the IP circuitry has an IP circuitry supply threshold for IP circuitry operation;
    a supply monitor circuit coupled to the power supply line and sensitive to a voltage on the power supply line, the supply monitor circuit configured to switch the processing circuit to a low-power mode as a result of a drop in the voltage on the power supply line,
        wherein the supply monitor circuit comprises a threshold setting node and is configured to be deactivated as a result of the voltage on the power supply line dropping below a deactivation threshold level set at the threshold setting node; and
    a threshold setting circuit coupled to the threshold setting node of the supply monitor circuit, the threshold setting circuit configured to apply, to the threshold setting node of the supply monitor circuit, the IP circuitry supply threshold as a result of the processing circuit being in the low-power mode.

2. The device of claim 1, wherein the threshold setting circuit comprises a multiplexer having an input configured to receive the IP circuitry supply threshold and an output coupled to the threshold setting node of the supply monitor circuit, the multiplexer controlled by a low-power mode signal indicative of the processing circuit being switched to the low-power mode.

3. The device of claim 1,
    wherein the supply monitor circuit comprises an enable input coupled to the processing circuit; and
    wherein the device comprises enablement maintaining circuitry coupling the processing circuit and the enable input of the supply monitor circuit, the enablement maintaining circuitry configured to apply an enablement signal to the enable input of the supply monitor circuit irrespective of the processing circuit being in the low-power mode.

4. The device of claim 3, wherein the enablement maintaining circuitry comprises:
    memory circuitry having stored therein supply monitor circuit enablement information; and
    an OR gate having an output coupled to the enable input of the supply monitor circuit and first and second inputs coupled to the processing circuit and the memory circuitry, respectively.

5. The device of claim 3, comprising:
    an IP activation sensing line coupled to the IP circuitry, the IP activation sensing line configured to carry an IP activation signal indicative of the IP circuitry being active or inactive,
    wherein the enablement maintaining circuitry is coupled with the IP activation sensing line to receive therefrom the IP activation signal and discontinue applying the enablement signal to the enable input of the supply monitor circuit as a result of the IP activation signal being indicative of the IP circuitry being inactive.

6. The device of claim 5, wherein the enablement maintaining circuitry is sensitive to a low-power mode signal indicative of the processing circuit being switched to the low-power mode and configured to deactivate the supply monitor circuit as a result of both the IP activation signal being indicative of the IP circuitry being inactive and the low-power mode signal being indicative of the processing circuit being switched to the low-power mode.

7. The device of claim 1, comprising wake-up circuitry coupled to the supply monitor circuit and configured to apply to the processing circuit a wake-up signal causing the processing circuit to exit the low-power mode as a result of the voltage on the power supply line dropping below the IP circuitry supply threshold.

8. A method comprising:
    receiving, by a processing circuit and intellectual property core (IP) circuitry, power from a power supply line, the IP circuitry having an IP circuitry supply threshold for IP circuitry operation;
    switching, by a supply monitor circuit, the processing circuit to a low-power mode in response to a drop in a voltage on the power supply line;
    deactivating the supply monitor circuit in response to the voltage on the power supply line dropping below a deactivation threshold level set at a threshold setting node of the supply monitor circuit; and
    apply, by a threshold setting circuit to the threshold setting node of the supply monitor circuit, the IP circuitry supply threshold in response to the processing circuit switching to the low-power mode.

9. The method of claim 8, further comprising:
    receiving, by a multiplexer of the threshold setting circuit, the IP circuitry supply threshold;

generating, by the multiplexer, an output to the threshold setting node of the supply monitor circuit; and controlling the multiplexer by a low-power mode signal indicating the processing circuit switching to the low-power mode.

10. The method of claim 8, further comprising:

applying, by an enablement maintaining circuitry, an enablement signal to an enable input of the supply monitor circuit irrespective of the processing circuit being in the low-power mode.

11. The method of claim 10, further comprising:

storing, in memory circuitry of the enablement maintaining circuit, supply monitor circuit enablement information; and logical OR'ing first and second inputs coupled to the processing circuit and the memory circuitry, respectively, to generate an enable output to the supply monitor circuit.

12. The method of claim 10, comprising:

carrying, by an IP activation sensing line, an IP activation signal indicative of the IP circuitry being active or inactive;

receiving, by the enablement maintaining circuitry from the IP activation sensing line, the IP activation signal; and discontinuing applying the enablement signal to the enable input of the supply monitor circuit in response to the IP activation signal indicating the IP circuitry is inactive.

13. The method of claim 12, further comprising:

receiving, by the enablement maintaining circuitry, a low-power mode signal indicating the processing circuit is switched to the low-power mode; and deactivating, by the enablement maintaining circuitry, the supply monitor circuit in response to both the IP activation signal indicating the IP circuitry is inactive and the low-power mode signal indicating the processing circuit is switched to the low-power mode.

14. The method of claim 8, further comprising:

apply, by wake-up circuitry coupled to the supply monitor circuit, to the processing circuit, a wake-up signal causing the processing circuit to exit the low-power mode in response to the voltage on the power supply line dropping below the IP circuitry supply threshold.

* * * * *